United States Patent
Nieberlein et al.

(10) Patent No.: US 12,004,316 B2
(45) Date of Patent: Jun. 4, 2024

(54) FLEXIBLY CONFIGURABLE CONVERTER UNITS

(71) Applicant: SIEMENS AKTIENGESELLSCHAFT, Munich (DE)

(72) Inventors: Klaus Nieberlein, Nuremberg (DE); Falko Baumann, Ottensoos (DE); René Junghänel, Marloffstein (DE); Matthias Nährig, Bayern (DE); Jens Schmenger, Forchheim (DE); Jennifer Lautner, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 259 days.

(21) Appl. No.: 17/761,495

(22) PCT Filed: Aug. 6, 2020

(86) PCT No.: PCT/EP2020/072075
§ 371 (c)(1),
(2) Date: Mar. 17, 2022

(87) PCT Pub. No.: WO2021/052675
PCT Pub. Date: Mar. 25, 2021

(65) Prior Publication Data
US 2022/0369490 A1 Nov. 17, 2022

(30) Foreign Application Priority Data
Sep. 18, 2019 (EP) .................................... 19198070

(51) Int. Cl.
*H05K 1/02* (2006.01)
*H02M 1/088* (2006.01)
(Continued)

(52) U.S. Cl.
CPC .......... *H05K 7/1432* (2013.01); *H02M 1/088* (2013.01); *H02M 5/458* (2013.01); *H02M 7/537* (2013.01)

(58) Field of Classification Search
CPC .... H05K 7/1432; H02M 1/088; H02M 5/458; H02M 7/537
See application file for complete search history.

(56) References Cited

U.S. PATENT DOCUMENTS 9,667,177 B1 * 5/2017 Li ........................... H02M 5/00
9,722,510 B2 8/2017 Kunin et al.
(Continued)

OTHER PUBLICATIONS

PCT International Search Report and Written Opinion of International Searching Authority dated Oct. 22, 2020 corresponding to PCT International Application No. PCT/ EP2020/072075 filed Aug. 6, 2020.

*Primary Examiner* — Hoa C Nguyen
(74) *Attorney, Agent, or Firm* — Henry M. Feiereisen LLC

(57) ABSTRACT

A converter unit has a main printed circuit board (MPCB) on which at least one functional module is arranged. By the functional module, at least one AC voltage supplied to the functional module via first power connections of the functional module can be converted into at least two DC voltage potentials output via second power connections. The MPCB has conductor paths via which control signals can be supplied to control connections, and the MPCB has conductor paths which extend from a control unit to first and second control connections of the MPCB and via which the first and second control signals can be supplied to the first and second control connections. The functional module is at least mechanically connected to the MPCB at least in the region (Continued)

of the first and second control connections such that the functional module does not use the first and/or the second control signals.

4 Claims, 11 Drawing Sheets

(51) Int. Cl.
*H02M 5/458* (2006.01)
*H02M 7/537* (2006.01)
*H05K 7/14* (2006.01)

(56) References Cited

U.S. PATENT DOCUMENTS

| | | | |
|---|---|---|---|
| 2013/0242623 A1* | 9/2013 | Wei | H02M 7/493 |
| | | | 363/37 |
| 2015/0098257 A1 | 4/2015 | Brown et al. | |
| 2015/0194902 A1* | 7/2015 | Tian | H02M 7/4833 |
| | | | 363/37 |
| 2015/0318791 A1* | 11/2015 | Baumann | H02M 5/458 |
| | | | 318/504 |
| 2018/0091061 A1* | 3/2018 | Sakakibara | H02M 1/08 |
| 2018/0145602 A1* | 5/2018 | Wei | H02M 5/458 |
| 2019/0393801 A1* | 12/2019 | Agirman | H02P 27/08 |
| 2021/0058003 A1* | 2/2021 | Ni | H02M 5/4585 |

* cited by examiner

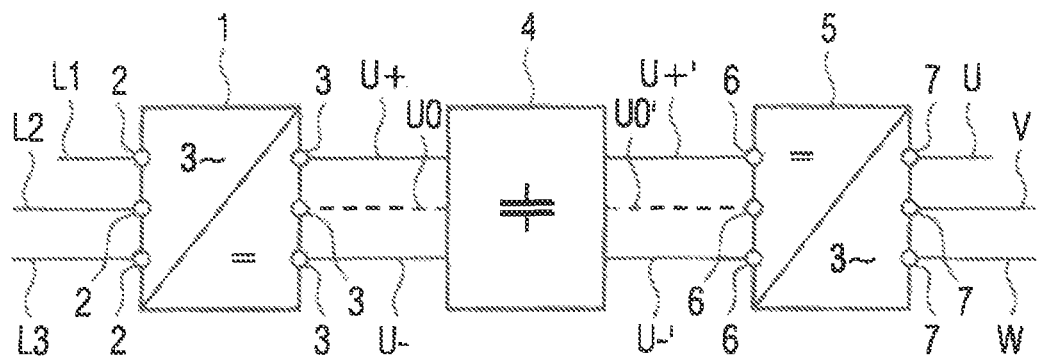
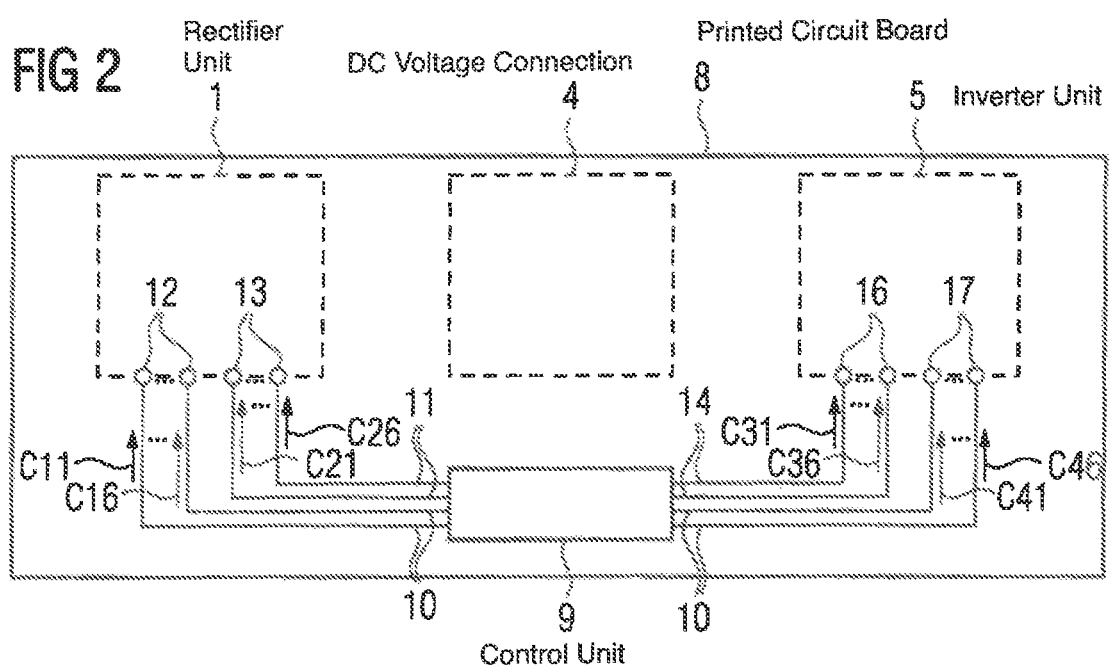

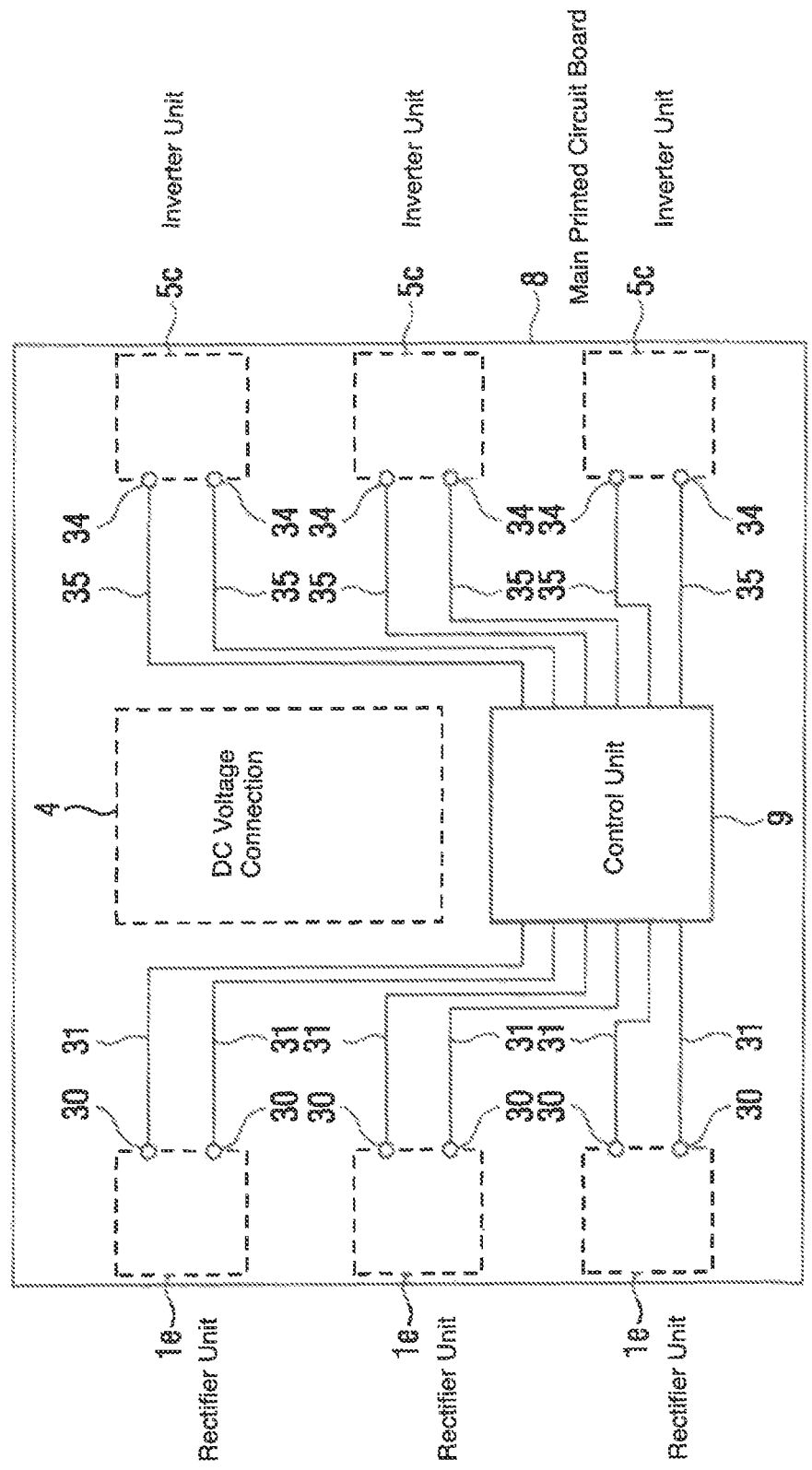

FLEXIBLY CONFIGURABLE CONVERTER UNITS

CROSS-REFERENCES TO RELATED APPLICATIONS

This application is the U.S. National Stage of International Application No. PCT/EP2020/072075 filed Aug. 6, 2020, which designated the United States and has been published as International Publication No. WO 2021/052675 A1 and which claims the priority of European Patent Application, Serial No, 19198070.5, filed Sep. 18, 2019, pursuant to 35 U.S.C. 119(a)-(d).

BACKGROUND OF THE INVENTION

The present invention is based on a converter unit, wherein the converter unit has a main printed circuit board,
   wherein at least one functional module is arranged on the main printed circuit board,
   wherein by means of the functional module at least one AC voltage supplied to the function module via first power connections of the functional module can be converted into at least two DC voltage potentials output via second power connections,
   wherein the main printed circuit board has conductor paths via which first and second control signals can be supplied to first and second control connection of the main printed circuit board,
   wherein the functional module is at least mechanically connected to the main printed circuit board at least in the region of the first and second control connections.

The present invention is also based on a combination of two converter units,
   wherein the converter units have identical main printed circuit boards,
   wherein in each case at least one functional module is arranged on the main printed circuit boards at mutually corresponding locations of the main printed circuit board,
   wherein by means of the respective functional module at least one respective AC voltage supplied to the respective functional module via first power connections of the respective functional module can be converted into in each case at least two DC voltage potentials output via second power connections of the respective functional module,
   wherein the first and second power connections of the functional module are similar in design and are arranged at mutually corresponding locations of the functional module,
   wherein the main printed circuit boards have respective conductor paths via which respective first and second control signals can be supplied to respective first and second control connections of the respective printed circuit board,
   wherein the respective functional module is at least mechanically connected to the respective main printed circuit board at least in the region of the respective first and second control connections.

As a rule, converter units have a plurality of functional units, which are arranged one behind the other viewed in the direction of the main energy flow. In practice usually seven functional units arranged one behind the other result. As a rule, the first functional unit is connected to the feeding supply network—usually a three-phase system—and is designed as an EMI filter. This is followed by a throttling unit as the second functional unit. This is often followed by a unit, which has shunt resistors in order to measure the input-side currents, as the third functional unit. In the individual case this functional unit can also be omitted, however. Furthermore, a further functional unit can be present, which contains a chopper. The next functional unit is a rectifier unit, which rectifies the supplied current. The fifth functional unit is conventionally designed as a DC voltage connection. In particular it can have backup capacitors in order to reduce the ripple of the DC voltage potentials. The sixth functional unit is designed as an inverter unit. The last functional unit is connected to the fed facility, usually an electric machine. As a rule, it is designed as an EMI filter in an analogous manner to the first functional unit.

Different embodiments are known for all of these functional units, depending on the voltage to be switched, current to be switched and other requirements. This results in a wide variety of types of converter units. Many different embodiments are known in particular for the rectifier unit and—even if to a lesser extent—also for the inverter unit.

The converter units are usually tailored specifically to the specifically implemented embodiment. This results in a wide variety of types and herewith also considerable development and servicing effort. If, for example, a circuit part of a converter unit, which is also used in other converter units, is modified then the data sheets, maintenance instructions, etc. of all corresponding converter units have to be updated. Furthermore, the wide variety of types leads to increased production costs. Extensive effort also results for the logistics and storage.

The object of the present invention consists in creating possibilities by means of which the wide variety of types of converter units can be significantly reduced.

SUMMARY OF THE INVENTION

The object is firstly achieved by a converter unit which includes a main printed circuit board, at least one functional module is arranged on the main printed circuit board, wherein by means of the functional module, at least one AC voltage supplied to the function module via first power connections of the functional module can be converted into at least two DC voltage potentials output via second power connections of the functional module, wherein the main printed circuit board has conductor paths via which first and second control signals can be supplied to first and second control connection of the main printed circuit board, wherein the functional module is at least mechanically connected to the main printed circuit board (8) at least in the region of the first and second control connections wherein the functional module is designed such that the functional module does not use the first control signals and/or the second control signals.

According to an advantageous embodiment of the converter unit, a control unit can be arranged on the main printed circuit board by means of which the first and second control signals can be generated for the functional module, wherein the conductor paths extend from the control unit to first and second control connections.

Inventively, a converter unit of the type mentioned in the introduction is configured in that the functional module is designed such that it does not use the first control signals and/or the second control signals.

As far as the functional module is concerned, the main printed circuit board is overdimensioned as it were. This is a—relatively minor—drawback, as far as the specifically implemented converter unit as such is concerned. The fundamental and decisive advantage lies in the fact that a completely identical main printed circuit board can be used in order to create a further converter unit with a different functionality. As far as the hardware is concerned, the functional module merely has to be appropriately adapted, so the appropriately adapted functional module uses at least part of the control signals which are not used by the original functional module.

Preferably, the control unit, by means of which the first and second control signals can be generated for the functional module, is arranged on the main printed circuit board itself. In this case the conductor paths extend from the control unit to the first and second control connections.

The object is also achieved by a combination of two converter units, as set forth hereinafter. An advantageous embodiment of the combination of two converter units is further set forth hereinafter.

Inventively, a combination of two converter units of the type mentioned in the introduction is configured such that
- the functional module of the one converter unit is designed such that it does not use the respective first control signals and/or the respective second control signals (and
- the functional module of the other converter unit is designed such that
  - in the event that the functional module of the one converter unit uses neither the first control signals that can be supplied to it nor the second control signals that can be supplied to it, the functional module of the other converter unit uses the first control signals that can be supplied to it and/dr the second control signals that can be supplied to it,
  - in the event that the functional module of the one converter unit uses the first control signals that can be supplied to it but not the second control signals that can be supplied to it, the functional module of the other converter unit uses at least the second signals that can be supplied to it, and
  - in the event that the functional module of the one converter unit uses the second control signals that can be supplied to it but not the first control signals that can be supplied to it, the functional module of the other converter unit uses at least the first control signals that can be supplied to it.

This corresponds exactly to the previously mentioned case where, in other words, the functional model of the one converter unit does not use particular control signals while the corresponding control signals are used by the functional module of the other converter unit.

Preferably, one control unit is arranged on the main printed circuit boards in each case, by means of which the respective first and second control signals can be generated for the respective functional module. In this case, the conductor paths of the respective main printed circuit board extend from the respective control unit to the first and second control connections of the respective main printed circuit board.

BRIEF DESCRIPTION OF THE DRAWING

The above-described properties, features and advantages of this invention and the manner in which they are achieved will become clearer and more comprehensible in conjunction with the following description of the exemplary embodiments, which will be explained in more detail in connection with the drawings. In the drawings, in a schematic representation:

FIG. 1 shows fundamental functional units of a converter unit,
FIG. 2 shows a main printed circuit board,
FIG. 12 shows a main printed circuit board.

DETAILED DESCRIPTION OF PREFERRED EMBODIMENTS

Figure 3:
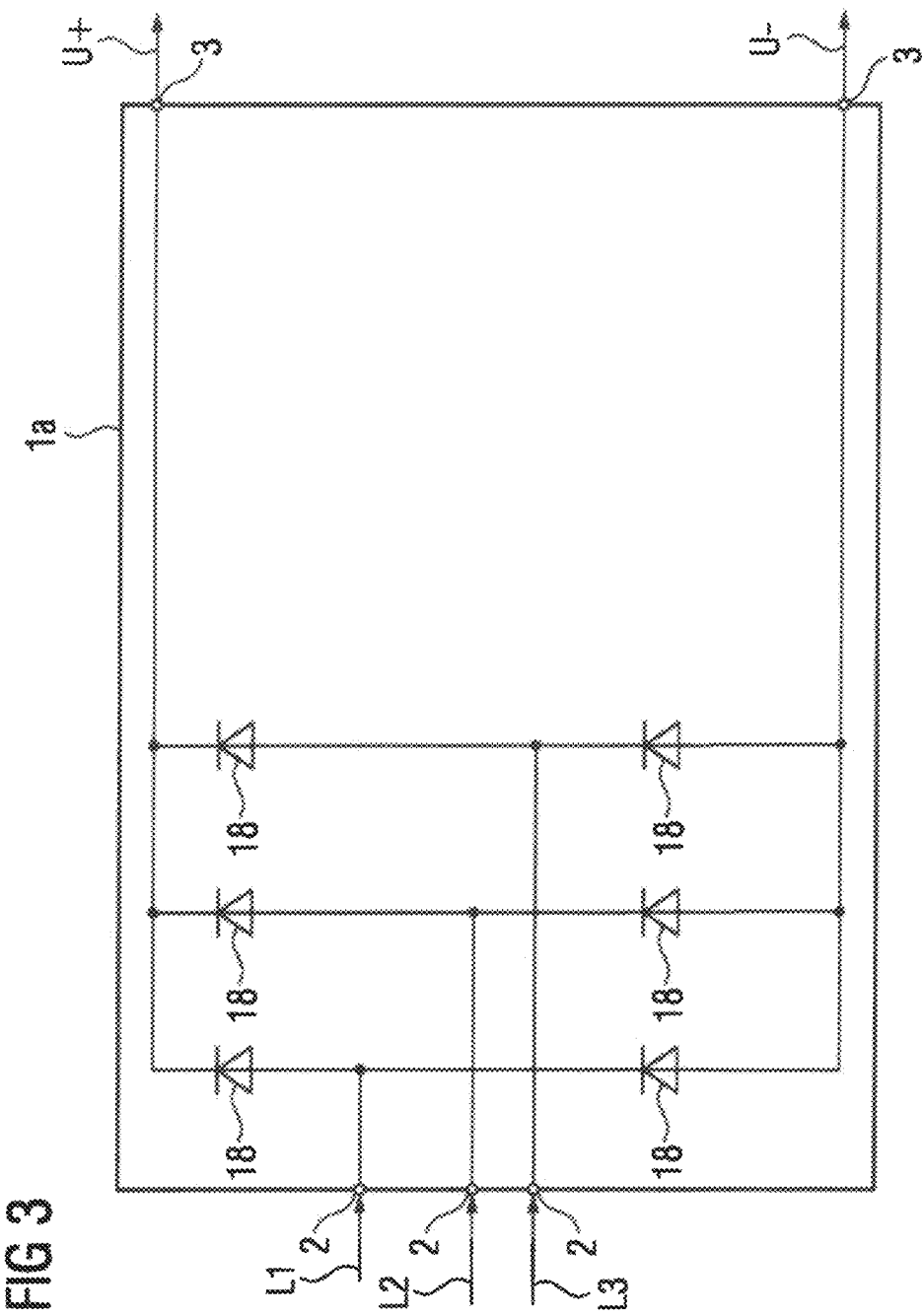
FIGS. 3 to 6 show rectifier units.

According to FIG. 1, a converter unit has as a fundamental functional unit firstly a rectifier unit 1. AC voltages L1, L2, L3 (phases), as a rule AC voltages of a three-phase system, are supplied to the rectifier unit 1 via first power connections 2 of the rectifier unit 1. The rectifier unit 1 is capable of converting the AC voltages supplied to it into at least two DC voltage potentials U+, U−. The rectifier unit 1 outputs DC voltage potentials U+, U− via second power connections 3. Possible embodiments of the rectifier unit 1 will be explained in more detail later.

The output DC voltage potentials U+, U− are supplied to a DC voltage connection 4. The DC voltage connection 4 is a further fundamental functional unit of the converter unit. As a rule, the DC voltage connection 4 has a capacitor network internally, so the DC voltage potentials U+, U− are flattened.

The DC voltage potentials U+, U− are supplied to an inverter unit 5. The inverter unit 5 is a further fundamental functional unit of the converter unit. The inverter unit 3 receives the DC voltage potentials U+, U− via second power connections 6. The inverter unit 5 is capable of converting the DC voltage potentials U+, U− supplied to it into at least one AC voltage, as a rule into three AC voltages U, V, W (phases) of a three-phase system. The inverter unit 5 outputs the AC voltages U, V, W via first power connections 7.

The power connections 6 of the inverter unit 5, via which the inverter unit 5 receives the DC voltage potentials U+, U−, are referred to as second power connections, while the power connections 7 of the inverter unit 5, via which the inverter unit 5 outputs the AC voltages U, V. W, are referred to as first power connections. The reason for this is that it is basically possible to operate the inverter unit 5 such that it rectifies at least one AC voltage U, V, W supplied to it. This does not represent the normal operation of the inverter unit 5 but it is basically possible if the inverter unit 5 is appropriately actuated. This results in a uniform use of the terminology: the first power connections 2, 7 are arranged on the AC voltage side of the respective unit 1, 5 both in the case of the rectifier unit 1 and the inverter unit 5, the second power connections 3, 6 are arranged on the OC voltage side.

According to FIG. 2 the converter unit has a main printed circuit board 8. At least one functional module is arranged on the main printed circuit board 8. As a rule, a plurality of functional modules are arranged on the main printed circuit board 8, namely at least the rectifier unit 1, the DC voltage connection 4 and the inverter unit 5. The corresponding regions at which said units 1, 4, 5 are arranged are drawn in dashed lines in FIG. 2 and provided with the corresponding reference characters. Said units 1, 4, 5 are at least mechanically connected to the main printed circuit board 8 in these regions. Further units can also be arranged on the main printed circuit board 8, in particular the unit, which is used for measurement of the input-side currents, and/or the EMI filter through to the electric machine, optionally also the throttling unit and optionally even the EMI filter to the supply network 7. This is of secondary importance within the framework of the present invention, however. These units will not be discussed in further detail below, therefore. Furthermore, it is possible in the individual case that it is not both the rectifier unit 1 and the inverter unit 5 that are arranged on the main printed circuit board 8 but only either the rectifier unit 1 or the inverter unit 5 and, more precisely, with or without the DC voltage connection 4.

Preferably, a control unit 9 is arranged on the main printed circuit board 8. The control unit 9 can likewise be a functional module of the main printed circuit board 8. Alternatively, it can be an integral part of the main printed circuit board 8. A peer supply and the associated wiring arrangement for the control unit 9 and optionally also for other components of the converter unit can also be arranged on the main printed circuit board 8. Detected measurement values can also be evaluated on the main printed circuit board 8. The evaluation can take place in particular by way of the control unit 9. Furthermore, the main printed circuit board 8 can have protective circuits.

The control unit 9 is capable of generating a large number of control signals C11 to C16, C21 to C26 and/or C31 to C36 and C46 to C46. The control signals C11 to C16 and C21 to C26 are intended for the rectifier unit 1. The main printed circuit board 8 therefore has conductor paths 10, 11 via which the control signals C11 to C16 and C21 to C26 are supplied to control connections 12, 13 of the main printed circuit board 8. The conductor paths 10, 11 extend therefore, if the control unit 9 is arranged on the main printed circuit board 8, from the control facility 9 to the control connections 12, 13. The control connections 12, 13 are arranged in the region in which the rectifier unit 1 is at least mechanically connected to the main printed circuit board 8. The control signals C31 to C36 and C46 to C46 are intended for the inverter unit 5. The main printed circuit board 8 therefore has conductor paths 14, 15 via which the control signals C31 to C36 and C46 to C46 are supplied to control connections 16, 16 of the main printed circuit board 8. The conductor paths 14, 15 extend therefore, if the control unit 9 is arranged on the main printed circuit board 8, from the control facility 9 to the control connections 16, 17. The control connections 16, 17 are arranged in the region in which the inverter unit 5 is at least mechanically connected to the main printed circuit board 8. If only the rectifier unit 1 but not the inverter unit 5 is arranged on the main printed circuit board 8, it is obviously sufficient if the control unit 9 is capable of generating the control signals C11 to C16 and C21 to C26 but not the control signals C31 to C36 and C46 to C46. Similarly, it is obviously sufficient if the control unit 9 is capable of generating the control signals C31 to C36 and C46 to C46 but not the control signals C11 to C16 and C21 to C26 if only the inverter unit 5 but not the rectifier unit 1 is arranged on the main printed circuit board 8. Similarly, in this case only the corresponding control connections 12, 13 or 16, 17 and the associated conductor paths 10, 11 or 14, 15 have to be present too.

Possible embodiments of the rectifier unit 1 will be explained below in connection with FIGS. 3 to 6, The reference character for the rectifier unit 1 is supplemented in the framework of these embodiments by a lower case letter a to din order to be able to distinguish between the different rectifier units 1 if required. If only the reference character 1 is used below therefore, the corresponding statements refer to any of the rectifier units 1a to 1d, If the reference character 1a is specifically used, the corresponding statement refers only to rectifier unit 1a, Analogous statements apply to rectifier units 1b, 1c and 1d.

In the embodiment according to HG 3, the rectifier unit Is has first diodes 18. The AC voltages L1, L2, L3 supplied to the rectifier unit 1a are rectified by means of the first diodes 18. Further components, as far as the rectification is concerned, are not present. In accordance with the illustration in FIG. 3 the rectifier unit 1a is designed as an uncontrolled rectifier unit, therefore. The first diodes 18 are also present in the other rectifier units 1b to 1d.

Figure 4:
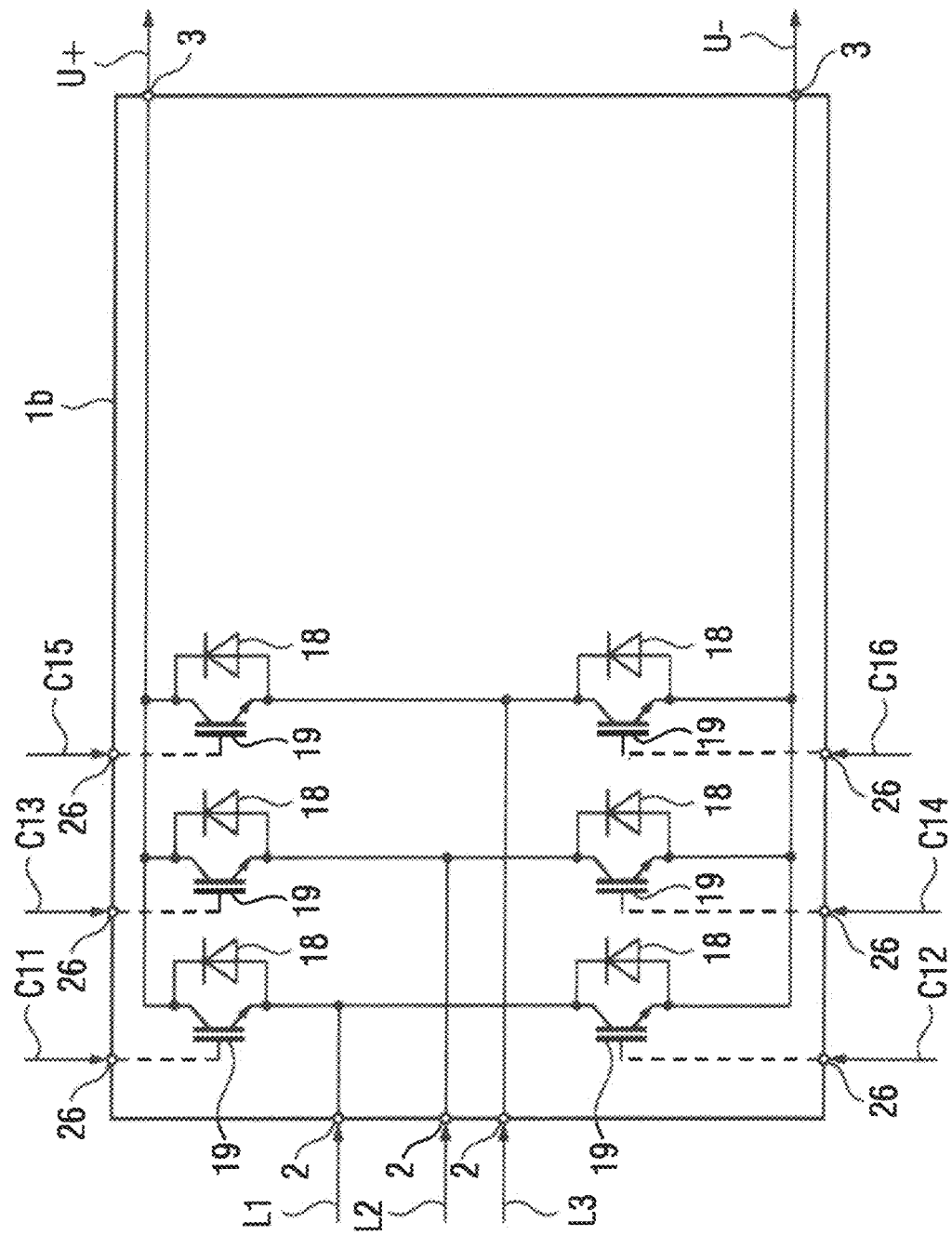

In the embodiment according to FIG. 4, in addition to the first diodes 18, the rectifier unit 1b has first electronic switches 19 (for example IGBTs or FETs), which are wired parallel to the first didoes 18. The first diodes 18 can in this case alternatively be independent components or be intrinsic elements of the first electronic switches 19. The control signals C11 to C16 are supplied to the first electronic switches 19. The rectifier unit 1b therefore has mating contacts 26, which are mechanically and electrically connected to the control connections 12, The rectifier unit 1b, with appropriate specification of the control signals C11 to C16 by the control unit 9, can thus also perform an energy recovery into the supply network.

Figure 5:
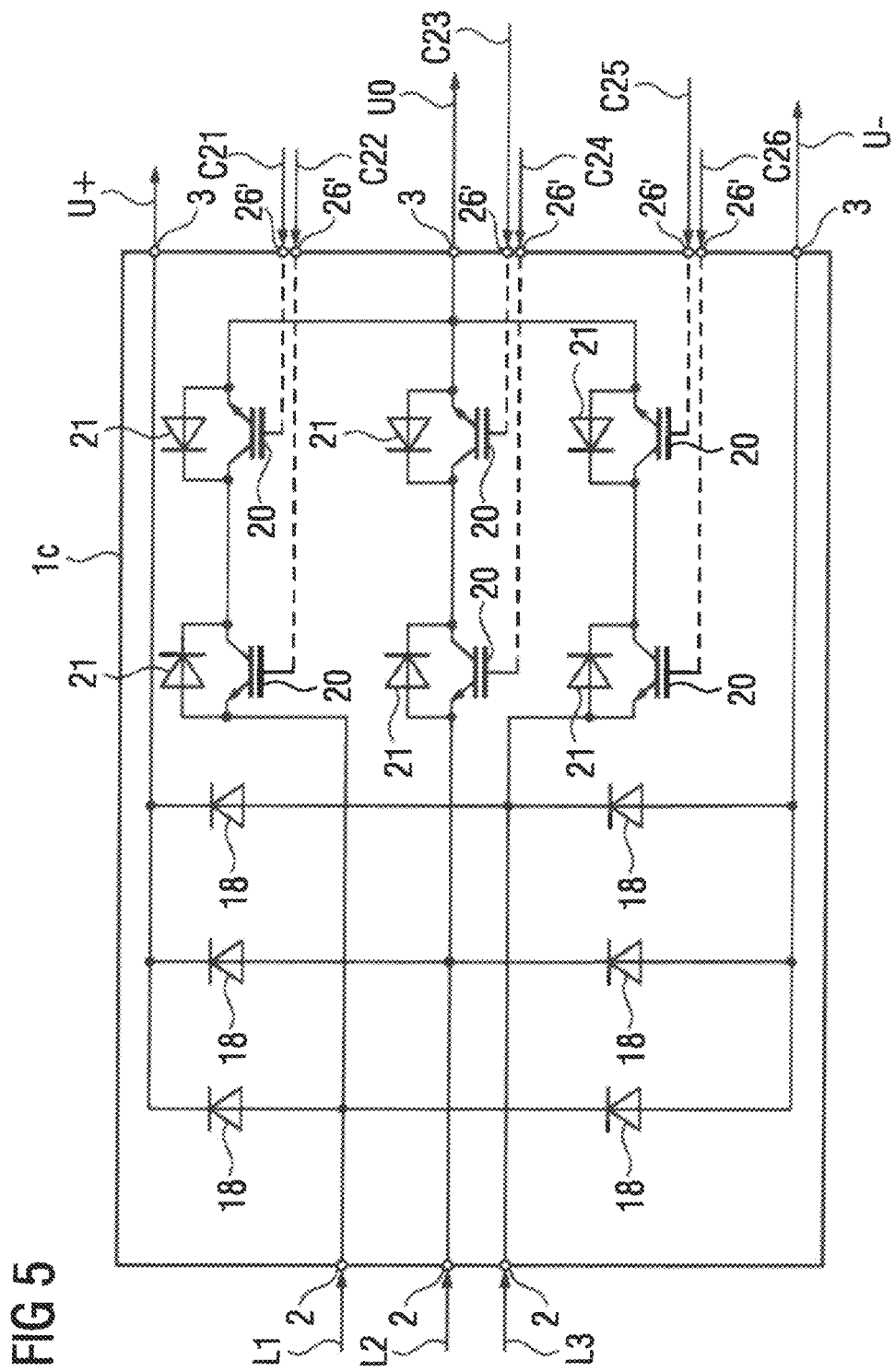

In the embodiment according to FIG. 5, in addition to the first diodes 18, the rectifier unit 1c also has second electronic switches 20 (for example IGBTs or FETs). Second diodes 21 can optionally wired parallel to the second electronic switches 20. The second diodes 21 can alternatively be independent components or intrinsic elements of the second electronic switches 20. The control signals C21 to C26 are supplied to the second electronic switches 20. The rectifier unit 1c therefore has mating contacts 26', which are mechanically and electrically connected to the control connections 13. By means of the second electronic switches 20 the rectifier units 1c, with appropriate specification of the control signals C21 to C26 by the control unit 9, can thus provide an additional DC voltage potential U0 at the DC voltage side. In this case the rectifier unit 1c also has an additional second power connection 3 via which the additional DC voltage potential U0 is output.

Figure 6:
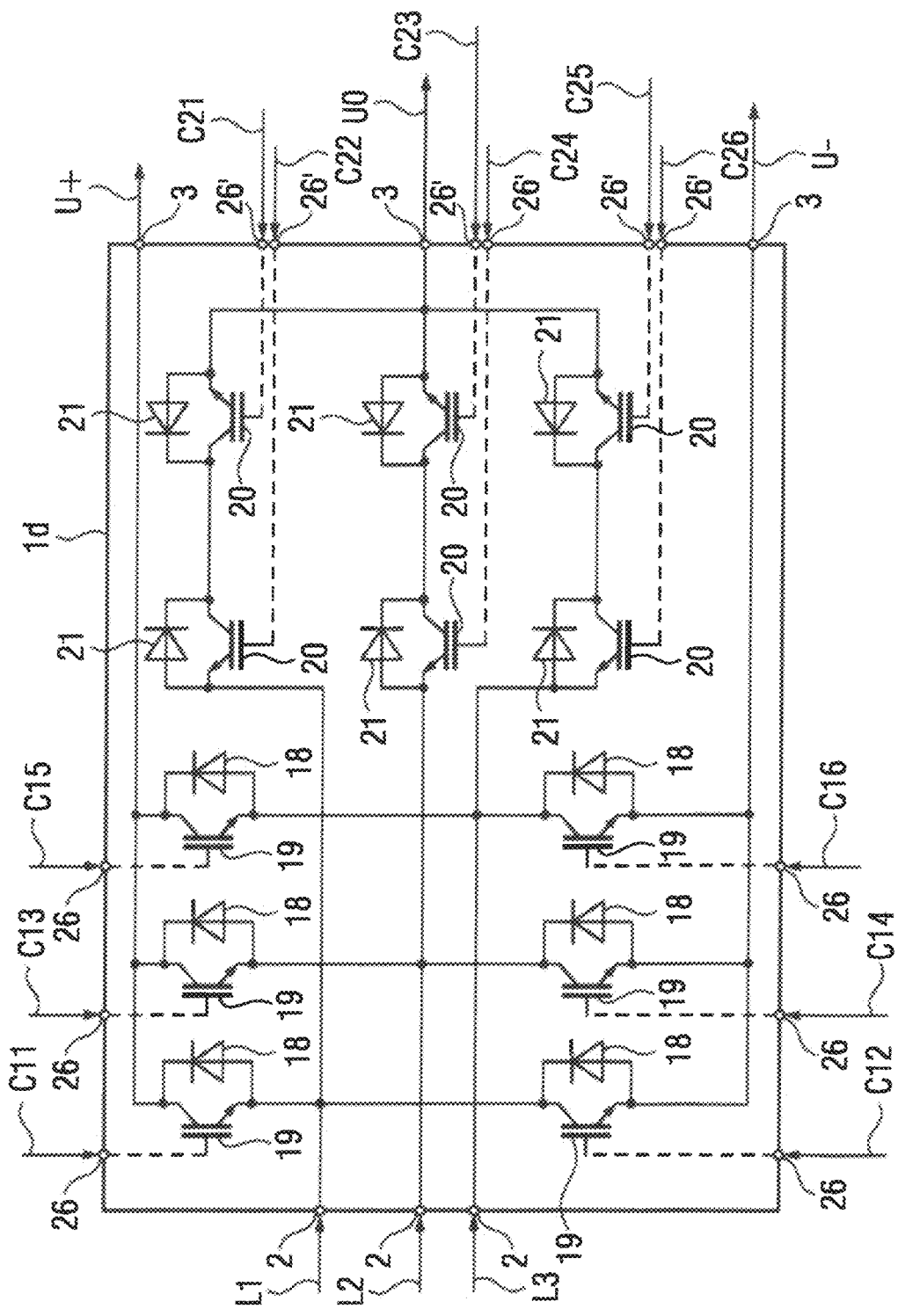

In the embodiment according to FIG. 6, in addition to the first diodes 18, the rectifier unit 1d has both the first electronic switches 19 and the second electronic switches 20. The second diodes 21 can optionally again be wired parallel to the second electronic switches 20. The rectifier unit 1 therefore combines the additional possibilities of the rectifier units 1b and 1c.

Possible embodiments of the inverter unit 5 will be explained below in connection with FIGS. 7 and 8. The reference character for the inverter unit 5 is supplemented in the framework of these embodiments by a lower case letter a and b in order to be able to distinguish between the different inverter units 5 if required. If only the reference character 5 is used below therefore, the corresponding statements refer to both of the inverter units 5a and 5b. If the reference character 5a or 5b is specifically used, the corresponding statement refers only to the corresponding inverter unit 5a or 5b respectively.

Figure 7:
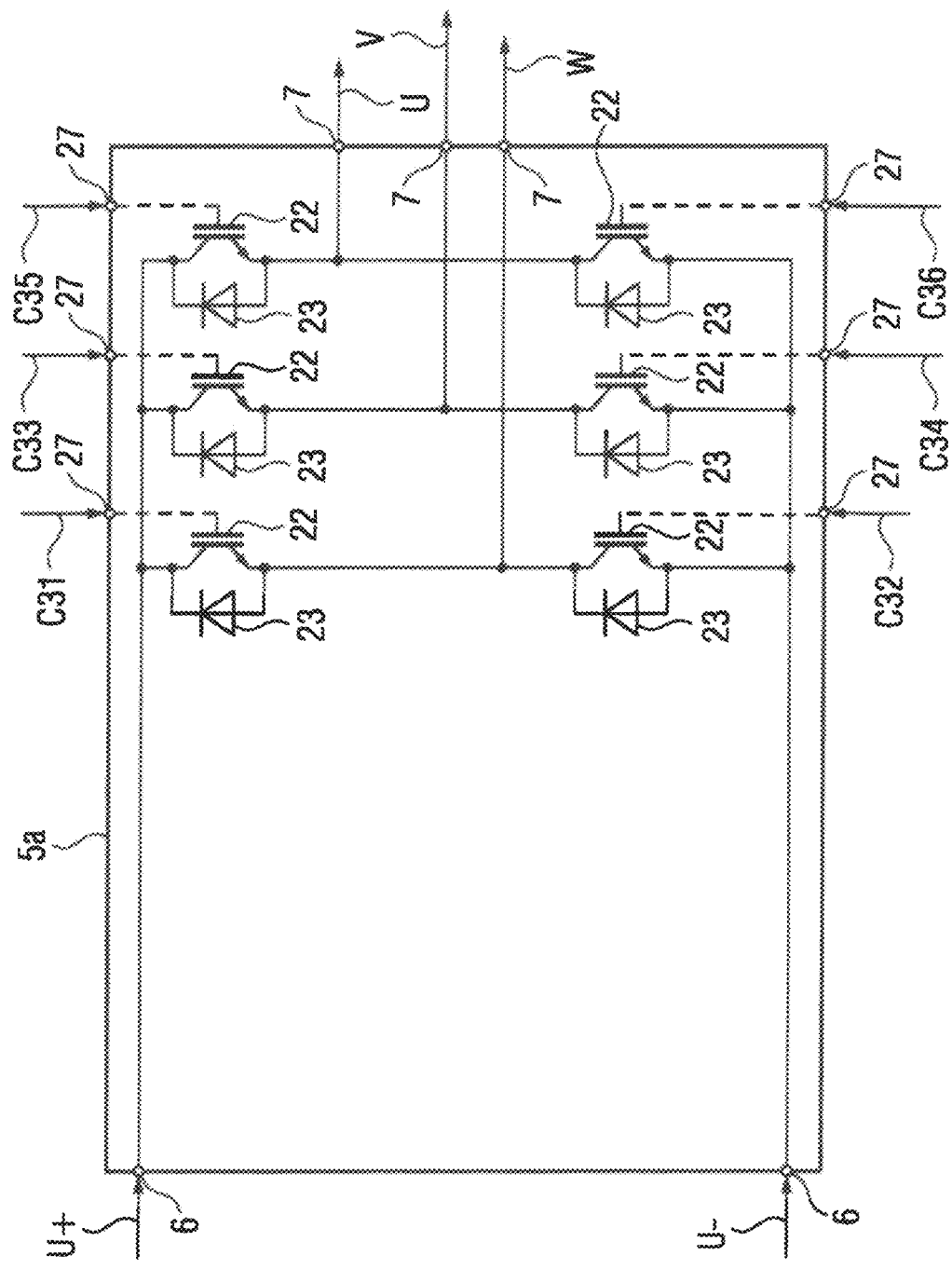
FIGS. 7 and 8 show inverter units.

In the embodiment according to FIG. 7, the inverter unit 5a has first electronic switches 22 (for example IGBTs or FETs). First diodes 23 are wired parallel to the first electronic switches 22. The first diodes 23 can alternatively be independent components or intrinsic elements of the first electronic switches 22. The control signals C21 to C36 are supplied to the first electronic switches 22. The inverter unit 5a therefore has mating contacts 27, which are mechanically and electrically connected to the control connections 16.

Depending on the specification of the control signals C21 to C36 by the control unit 9, inverter unit 5a can thus induce both a current flow from the DC voltage side to the AC voltage side as well as vice versa. The current flow from the DC voltage side to the AC voltage side represents the normal operation of the inverter unit 5a; the reverse current flow from the AC voltage side to the DC voltage side is an exception.

Figure 8:
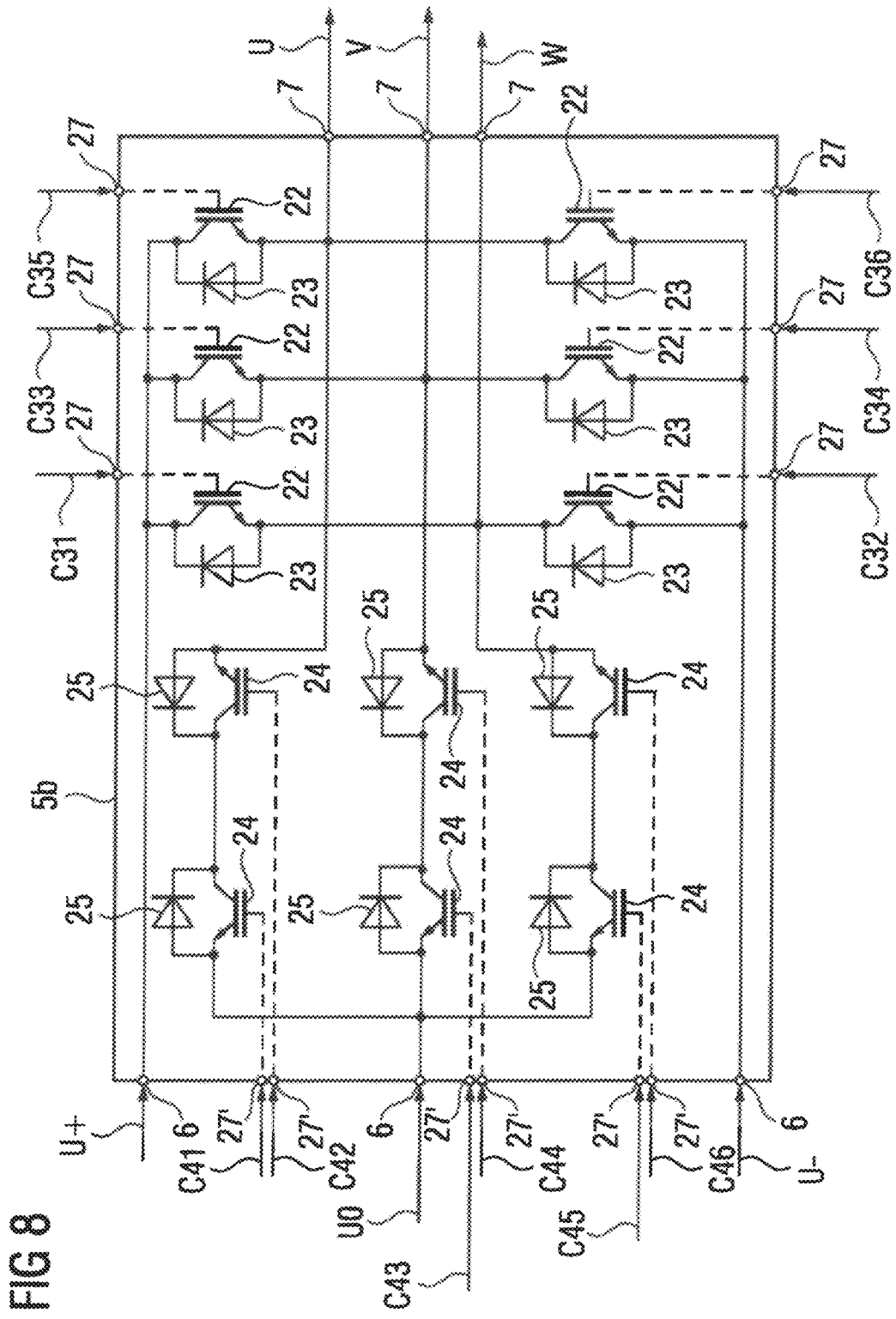

In the embodiment according to FIG. 8, the inverter unit 5b additionally has second electronic switches 24 (for example IGBTs or FETs). Second diodes 25 can optionally be wired parallel to the second electronic switches 24. The second diodes 25 can alternatively be independent components or intrinsic elements of the second electronic switches 24. The control signals C41 to C46 are supplied to the second electronic switches 24. The inverter unit 5a therefore has mating contacts 27', which are mechanically and electrically connected to the control connections 17. By means of the second electronic switches 20 the inverter unit 5b, with appropriate specification of the control signals C41 to C46 by the control unit 9, can thus use an additional DC voltage potential U0 provided at the DC voltage side, or conversely provide an additional DV voltage potential U0 of this kind at the DC voltage side. In this case the inverter unit 5b also has an additional second power connection 6 via which the additional DC voltage potential U0 is supplied or output.

The coordination of the different rectifier units 1a to 1d with each other and the different inverter units 5a, 5b with each other is of crucial importance.

Because the respective internal construction of the respective rectifier units 1a to 1d is individual for the respective rectifier unit 1a to 1d, in contrast the shared interfaces outwardly—in other words the first and second power connections 2, 3 and the mating connections 26, 26' are uniformly arranged and uniformly designed. Each of the rectifier units 1a to 1d can be assumed for the power connections 2, 3 because the power connections 2, 3 are present in each of the rectifier units 1a to 1d. The rectifier unit 1d is the "master" for the arrangement of the mating connections 26, 26' because the rectifier unit 1d uses the control signals C11 to C16 and the control signals C21 to C26. It therefore has to have both the mating connections 26 and the mating connections 26'.

In the case of rectifier unit 1b the mating connections 26 for the control connections 12 at arranged at the same position as in the case of rectifier unit 1d. The mating connections 26 for the control connections 12 also have the same design as the mating connections 26 for the control connections 12 of the rectifier unit 1d, At the positions at which the mating connections 28' for the control connections 13 are arranged in the case of rectifier unit 1d, there are either no mating connections arranged in the case of rectifier unit 1b, however (in other words no mating connections for any other connections either) or there are mating connections 26 arranged there but the mating connections 26 are not wired further inside the rectifier unit 1b. In each case the rectifier unit 1b does not use the control signals C21 to C26. This applies independently of whether the control unit 9 generates the control signals C21 to C26 or not. If in the case of rectifier unit 1b the mating connections 26' are present for the control connections 13, they are also designed to be compatible with the mating connections 26' for the control connections 13 of the rectifier unit 1d.

The rectifier unit 1c is implemented in a completely analogous manner. Specifically, in the case of rectifier unit 1c the mating connections 26' for the control connection 13 are arranged at the same position as in the case of rectifier unit 1d. The mating connections 26' for the control connections 12 are also identical in design to the mating connections 26' for the control connections 13 of the rectifier unit 1d. At the positions at which in the case of rectifier unit 1d the mating connections 26 for the control connections 12 are arranged in the case of rectifier unit 1d, however, there are either no mating connections arranged in the case of rectifier unit 1c at all or there are mating connections 26 arranged there but the mating connections 26 are not wired further inside the rectifier unit 1c. In each case the rectifier unit 1c does not use the control signals C21 to C26, This applies independently of whether the control unit 9 generates the control signals 11 to 16 or not. If in the case of rectifier unit 1c the mating connections 26 are present for the control connections 12, they are also designed to be compatible with the mating connections 26 for the control connections 12 of the rectifier unit 1d.

In the case of rectifier unit 1a the two measures implemented above for the rectifier units 1b and 1c are combined with each other. In the case of rectifier unit 1a the mating connections 26 for the control connections 12 and the mating connections 26' for the control connections 13 can be alternatively present or not be present. If the mating connections 26, 26' are not present there are no connections at all present at the corresponding positions. If the mating connections 26, 26' are present they are arranged at the same position as in the case of rectifier unit 1d and designed to be compatible with the mating connections 26, 26' for the control connections 12, 13 of the rectifier unit 1d. The mating connections 26, 26' of the rectifier unit 1a are not wired further inside the rectifier unit 1a in this case, however. In each case the rectifier units 1a uses neither the control signals C11 to C16 nor the control signals C21 to C26. This applies independently of whether the control unit 9 generates the control signals C11 to C16 and/or the control signals C21 to C26 or not.

The main printed circuit board 8 is, as already mentioned, designed such that it has the control connections 12 and the control connections 13. According to the illustration in FIG. 9 it is thereby possible to arrange, in the region in which the rectifier unit 1 is arranged, as required, the rectifier unit 1a, the rectifier unit 1b, the rectifier unit 1c or the rectifier unit 1d. A functioning converter unit results in each of these embodiments—assuming a correct embodiment of the rest of the converter unit.

The corresponding statements relating to the coordination of the construction of the rectifier units 1a to 1d is also analogously applicable to the inverter units 5a and 5b because the respective internal construction of the respective inverter unit 5a, 5b is individual to the respective inverter unit 5a, 5b but the shared interfaces are arranged in a uniform manner on the outside—in other words the first and second power connections 6, 7 and the mating connections 27, 27' for the control connections 16, 17, Each of the rectifier units 5a to 5b can be assumed for the power connections 6, 7 because the power connections 6, 7 are present in each of the rectifier units 5a to 5b. The rectifier unit 1d is the "master" for the arrangement of the mating connections 27, 27' because the rectifier unit 6b uses both the control signals C31 to C36 and the control signals C41 to C46. It therefore has to have the mating connections 27 and the mating connections 27'.

In the case of rectifier unit 5a the mating connections 27 for the control connections 16 are arranged at the same position as in the case of rectifier unit 5b. The mating connections 27 for the control connections 16 are also similar in design to the mating connections 27 for the control connections 16 of the rectifier 6*b*. At the positions at which the mating connections 27' for the control connections 17 are arranged in the case of inverter unit 5*b* there are either no mating connections arranged in the case of inverter unit 5*a* (in other words no mating connections for any other connections either) or there are mating connections 27' arranged there but the mating connections 27' are not wired further inside the inverter unit 5*a*. In each case the inverter unit 5*a* does not use the control signals C41 to C46. This applies independently of whether the control unit 9 generates the control signals C41 to C46 or not. If in the case of inverter unit 5*a* the mating connections 27' are present for the control connections 17, they are also designed to be compatible with the mating connections 27' for the control connections 17 of the inverter unit 5*b*.

Figure 9:
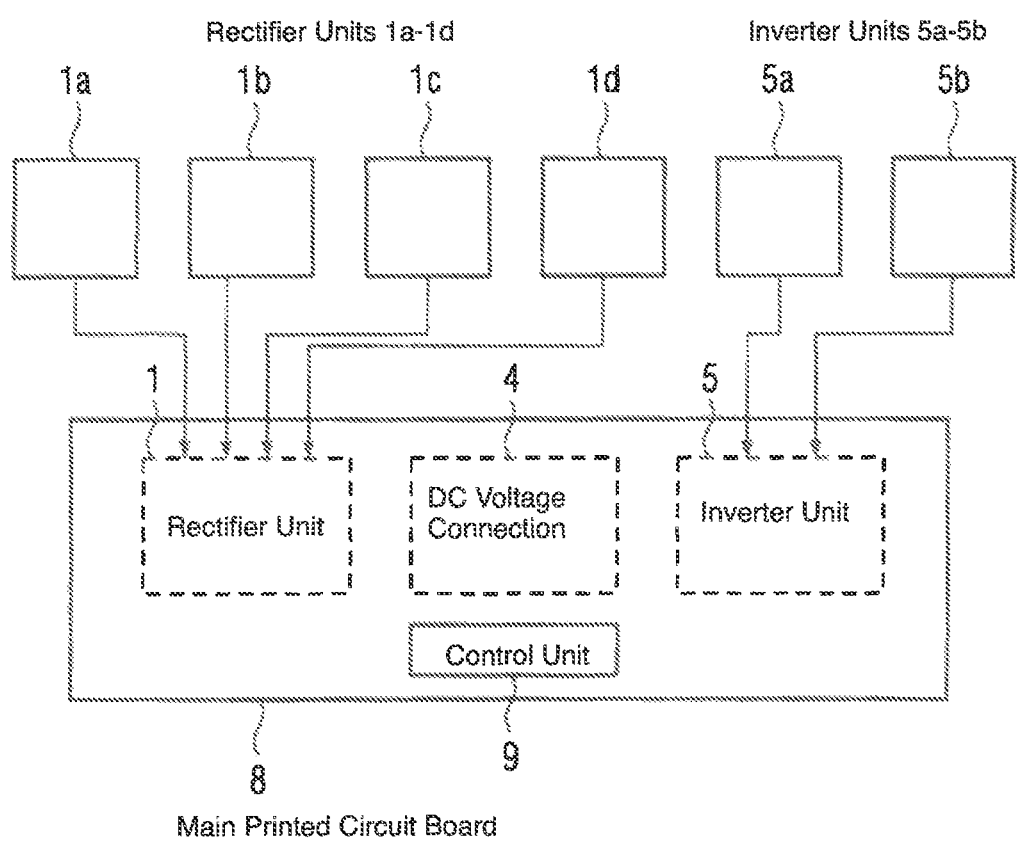
FIG. 9 shows possible configurations of a main printed circuit board with rectifier units and inverter units.

The main printed circuit board 8 is, as already mentioned, designed such that it has the control connections 16 and the control connections 17, According to the illustration in FIG. 9 it is thereby possible to arrange, in the region in which the inverter unit 5 is arranged, as required, the inverter unit 5*a* or the inverter unit 5*b*. A functioning converter unit results in each of these embodiments—assuming a correct embodiment of the rest of the converter unit.

Using one and the same main printed circuit board 8, eight different converter units can be implemented therefore in accordance with the illustration in FIG. 9, namely in the following combinations:

Rectifier unit 1*a*-Inverter unit 5*a*,
Rectifier unit 1*a*-Inverter unit 5*b*,
Rectifier unit 1*b*-Inverter unit 5*a*,
Rectifier unit 1*b*-Inverter unit 5*b*,
Rectifier unit 1*c*-Inverter unit 5*a*,
Rectifier unit 1*c*-Inverter unit 5*b*,
Rectifier unit 1*d*-Inverter unit 5*a*, and
Rectifier unit 1*d*-Inverter unit 5*b*.

In other words: if eight identical main printed circuit boards 8 are available, two each of the rectifier units 1*a* to 1*d* and four each of the converter units 5*a* and 5*b*, each of said eight converter units can be produced once. In the case of said eight converter units the rectifier units 1*a* to 1*d* are arranged at mutually corresponding locations of the main printed circuit boards 8. Analogously, the inverter units 6*a*, 5*b* are also arranged at mutually corresponding locations of the main printed circuit boards 8.

Only the generation of the control signals C11 to C46 by way of the control unit 9 has to be coordinated with the use of the respective rectifier unit 1*a* to 1*d* and the respective inverter unit 5*a*, 6*b*. This can be readily achieved by appropriate programing or parameterization of the control unit 9, In some cases it can even be tolerable, however, that control signals C11 to C46, which are not used at all by the specific rectifier unit 1 and/or by the specific rectifier unit 5, are generated by the control unit 9, An example of this: a converter unit is implemented with the rectifier unit 1*a* and the inverter unit 5*a*. The control unit 9 generates the control signals C11 to C16 and C31 to C36, The control signals C11 to C16 are then ignored by the rectifier unit Is without impairing the functionality of the rectifier unit Is while the inverter unit 5*a* is correctly actuated.

Possible embodiments of converter units were explained above in which the respective rectifier unit 1 is capable of rectifying three phases L1, L2, L3 of a three-phase system of and the respective inverter unit 5 is also normally operated such that it converts at least two DC voltage potentials U+, U−, U0 supplied to it into three phases U, V, W of a three-phase system, but basically is likewise capable of rectifying three phases U, V, W of a three-phase system. However, for both the rectifier unit 1 and for the inverter unit 5 it is possible that only one single first power connection 2, 7 is present on the respective inverter side. As a rule, single-phase embodiments on the inverter side of this kind are implemented if relatively high powers are to be transferred by means of the converter unit.

In each case one embodiment of a single-phase rectifier unit 1*e* and an embodiment of a single-phase inverter unit 5*a* of this kind in which this is the case will be explained below in connection with FIGS. 10 and 11, The corresponding single-phase rectifier unit 1 will be provided below with the reference character 1*e*, the corresponding single-phase inverter unit with the reference character 5*c*.

Furthermore, for the rectifier unit 5*e* only the case where it uses the control signals C11 to C16 and the control signals C21 to C26 will be explained. The corresponding reductions to the use of only the control signals C11 to C16 or the use of only the control signals C21 to C26 of the use of neither the control signals C21 to C16 nor the control signals C21 to 026 is completely analogous to the approach which was taken above in connection with FIGS. 3 to 6 for the three-phase embodiments of the rectifier unit 1. For the single-phase inverter unit 5*c* also only the case where it uses the control signals C31 to C36 and control signals C41 to 046 will be explained. The corresponding reduction to the use of only the control signals C31 to C36 is completely analogous to the approach which was taken above in connection with FIGS. 7 and 8 for the three-phase embodiments of the inverter unit 5.

Figure 10:
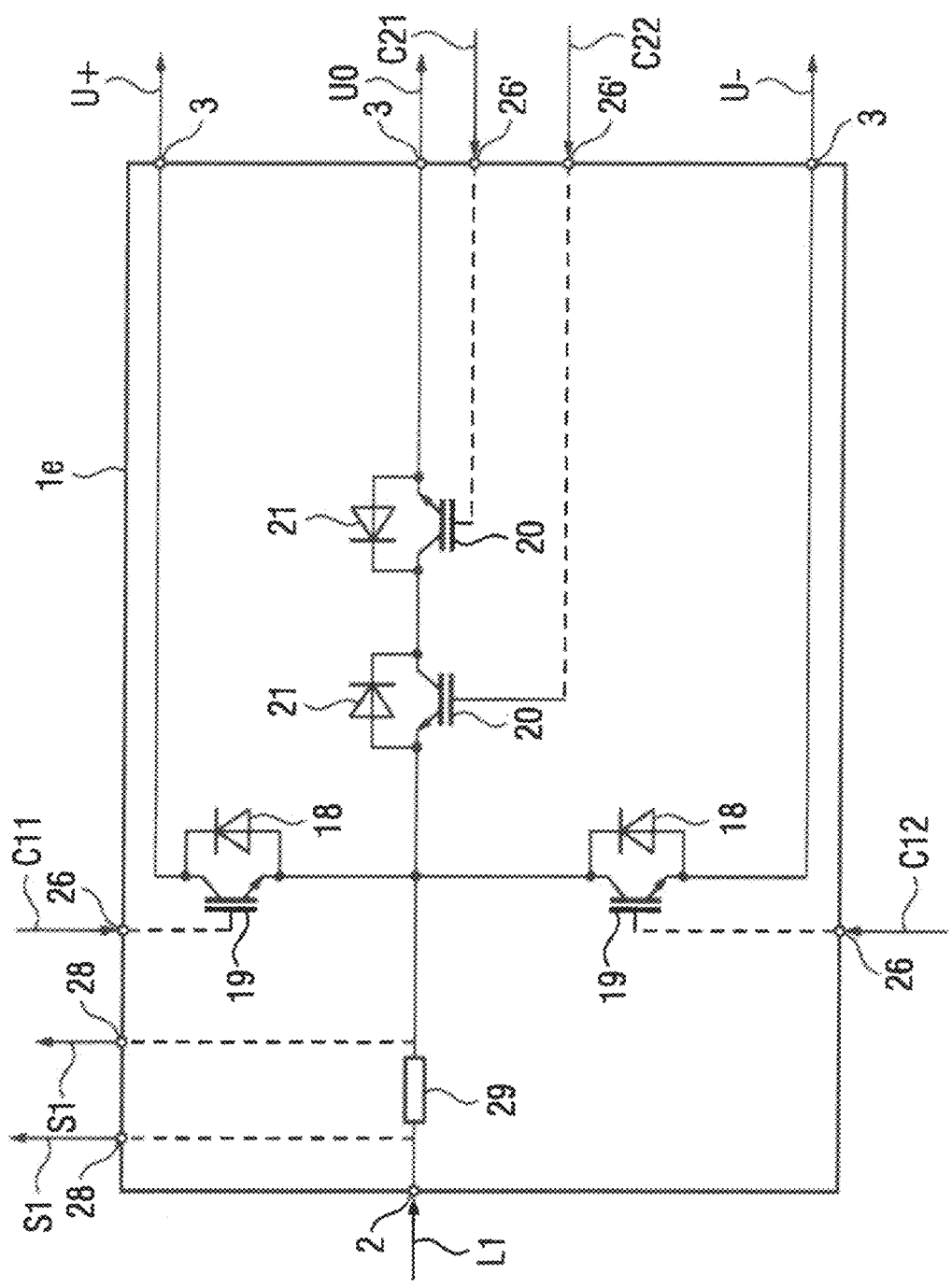
FIG. 10 shows a rectifier unit.

According to FIG. 10 the single-phase rectifier unit 1*e* has first diodes 18. The AC voltage supplied to single-phase rectifier unit 1*e* is rectified by means of the first diodes 18. Furthermore, the single-phase rectifier unit 1*e* has first electronic switches 19 (for example IGBTs or FETs) which are wired parallel to the first didoes 18. The control signals C11 and C12 or the control signals C13 and C14 or the control signals C15 and C16 are alternatively supplied to the first electronic switches 19. The single-phase rectifier unit 1*e*, with appropriate specification of the control signals C11 to 016 by the control unit 9, can thus also perform an energy recovery into the supply network. Furthermore, the single-phase rectifier unit 1*e* also has second electronic switches 20 (for example IGBTs or FETs). Optionally second diodes 21 can be wired parallel to the second electronic switches 20. The control signals C21 to C22 or the control signals C23 to C24 or the control signals C25 or C26 are alternatively supplied to the second electronic switches. The single-phase rectifier unit 1*e*, with appropriate specification of the control signals C21 to C26 by the control unit 9, can thus provide an additional DC voltage potential U0 at the DC voltage side by means of the second electronic switches 20.

Figure 11:
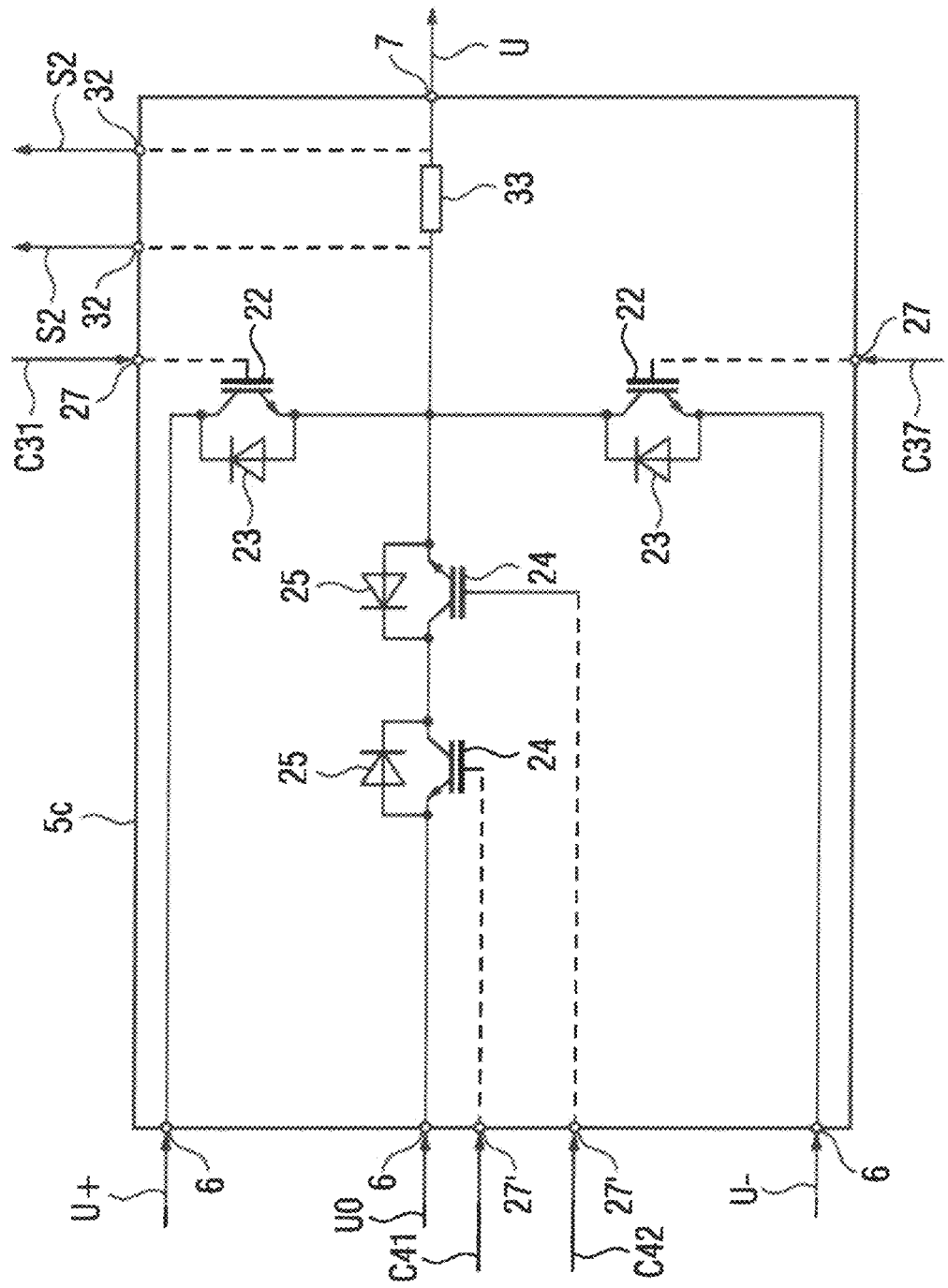
FIG. 11 shows an inverter unit.

According to FIG. 11 the single-phase rectifier unit 5*c* has first electronic switches 22 (for example IGBTs or FETs). First diodes 23 are wired parallel to the first electronic switches 22. The control signals C31 and C32 or the control signals C33 and C34 or the control signals C35 and C36 are alternatively supplied to the first electronic switches 22. Depending on the specification of the control signals C21 to C36 by the control unit 9, the single-phase inverter unit 5*c* can thus induce both a current flow from the DC voltage side to the AC voltage side and vice versa. Furthermore, the single-phase inverter unit 5*c* also has second electronic switches 24 (for example IGBTs or FETs). Optionally second diodes 25 can be wired parallel to the second electronic switches 24. The control signals C41 or C42 or the control signals C43 and C44 or the control signals C45 and C46 are supplied to the second electronic switches 20. By means of the second electronic switches 20 the single-phase inverter unit 5*c*, with appropriate specification of the control signals C41 to C46 by the control unit 9, can thus use an additional DC voltage potential U0 provided at the DC voltage side, or conversely can provide a DC voltage potential U0 of this kind at the DC voltage side.

In the case of the single-phase embodiment of the rectifier unit 1 and/or the inverter unit 5, as a rule in accordance with the illustration in FIG. 12 in each case three single-phase rectifier units 1*e* or inverter units 5*c* of this kind are arranged on the main printed circuit board 8, namely one each for the three phases L1, L2, L3 and U, V, W respectively. Generally speaking the single-phase rectifier units 1*e* have a similar design among themselves within the same converter unit and therewith on the same main printed circuit board 8, Similarly, generally speaking the single-phase inverter units 5*c* have a similar design among themselves, By contrast, the single-phase rectifier units 1*e* and/or the single-phase rectifier units 5*c* can vary from converter unit to converter unit.

The remaining statements, which were made above in relation to the three-phase embodiments of the rectifier unit 1 and the inverter unit 5 in respect of the internal construction, in respective of the presence or non-presence and the arrangement of the mating connections 26, 26', 27, 27' and the use or non-use of the control signals C11 to C46 and also the generation or non-generation of control signals C11 to C46, remain completely analogously applicable.

In accordance with the illustration in FIG. 10 it is possible that the single-phase rectifier unit 1*e* has sensor connections 28 via which (at least) one sensor signal S1 is output. For example, the single-phase rectifier unit 1*e* can have a shunt resistor 29 by means of which a voltage dropping across the shunt resistor 29, and therewith the current at the AC voltage side, is detected. If the sensor connections 28 are present or can be present at least in some embodiments of the single-phase rectifier unit 1*e*, the main printed circuit board 8 in accordance with the illustration in FIG. 12 has corresponding mating connections 30. The mating connections 30 are present in addition to the control connections 12, 13. The conductor paths 10, 11 and the control connections 12, 13 are not drawn in FIG. 12 in order to not overload FIG. 10 unnecessarily. They are, however, present.

The mating connections 30 too—analogously to the control connections 12, 13—are arranged in the region in which the single-phase rectifier unit 1*e* is at least mechanically connected to the main printed circuit board 8. The mating connections 30 are connected in this case to the control unit 9 via conductor paths 31. If the mating connections 30 are present the sensor connections 28 can either be present or not be present in the case of a particular rectifier unit 1. If the sensor connections 28 are not present no connections at all are arranged at the corresponding positions. If the sensor connections 28 are present they are arranged at the same position in all corresponding rectifier units 1. It is possible, however, that in some rectifier units 1 the sensor connections 28 are not wired further inside the respective rectifier unit 1.

An analogous embodiment is also possible in the case of three-phase rectifier units 1*a* to 1*d* and the associated main printed circuit board 8. In this case said embodiments are present for each phase L1, L2, L3.

In accordance with the illustration in FIG. 11 it is completely analogously possible that the single-phase inverter unit 5*c* has sensor connections 32 via which (at least) one sensor signal S2 is output. For example, the single-phase inverter unit 5*c* can have a shunt resistor 33 by means of which a voltage dropping across the shunt resistor 33 and therewith the current at the AC voltage side, is detected. If the sensor connections 32 are present or can be present at least in some embodiments of the single-phase inverter unit 5*c*, the main printed circuit board 8 has corresponding mating connections 34 in accordance with the illustration in FIG. 12. The mating connections 34 are present in addition to the control connections 16, 17. The conductor paths 14, 15 and the control connections 16, 17 are not drawn in FIG. 12 in order to not overload FIG. 12 unnecessarily. They are, however, present.

The mating connections 34 too—analogously to the control connections 16, 17—are arranged in the region in which the single-phase rectifier unit 5*c* is at least mechanically connected to the main printed circuit board 8. The mating connections 34 are connected to the control unit 9 via conductor paths 35 in this case. If the mating connections 34 are present the sensor connections 32 can either be present or not be present in the case of a particular inverter unit 5. If the sensor connections 32 are not present no connections at all are arranged at the corresponding positions. It is possible, however, that in some inverter units 5 the sensor connections 32 are not wired further inside the respective inverter unit 5.

An analogous embodiment is also possible in the case of three-phase inverter units 5*a* and 5*b* and the associated main printed circuit board 8. In this case said embodiments are present for each phase U, V, W.

It is possible that the power currents are conducted via the main printed circuit board 8. In this case the power connections 2, 3 of the rectifier unit 1 are connected to corresponding mating connections of the main printed circuit board 8. Alternatively, it is possible that the power currents are conducted outside of the main printed circuit board 8. In this case the power connections 2, 3 of the rectifier unit 1 can be connected, for example, to busbars or are accessible in some other way. Analogous statements apply to the power connections 6, 7 of the inverter unit 5.

In summary, the present invention relates to the following facts therefore:

A converter unit has a main printed circuit board 8 on which at least one functional module 1, 5 is arranged. By means of the functional module 1, 5 at least one AC voltage L1, L2, L3, U, V, W supplied to the functional module 1, 5 via first power connections 2, 7 of the functional module 1, 5 can be converted into at least two DC voltage potentials U+, U−, U0 output via second power connections 3, 6 of the functional module 1, 5. The main printed circuit board 8 has conductor paths 10, 11, 14, 15 via which the control signals C11 to C46 can be supplied to the control connections 12, 13, 16, 17. The functional module 1, 5 is at least mechanically connected to the main printed circuit board 8 at least in the region of the control connections 12, 13, 16, 17. However, it is designed such that it does not use the control signals C11 to C16, C31 to C36 and/or the control signals C21 to C26, C42 to C46.

The present invention has many advantages. In particular, said embodiments reduce the development costs and also the production costs. The complete flexibility in the design of the converter unit can nevertheless be retained. The range and the costs for storage of spare parts can also be reduced. These advantages are achieved in particular by the pin-compatible interfaces of the rectifier units 1 and optionally also of the inverter units 5.

Although the invention has been illustrated and described in detail by the preferred exemplary embodiment it is not limited by the disclosed examples and a person skilled in the art can derive other variations her from without departing from the scope of the invention.

What is claimed is:

1. A converter unit, comprising:
   a main printed circuit board including first and second control connections receiving first and second control signals via conductor paths of the main printed circuit board; and
   a functional module arranged on the main printed circuit board and at least mechanically connected to the main printed circuit board at least in a region of the first and second control connections, said functional module including first and second power connections, with an AC voltage supplied to the functional module via the first power connections being convertible into two DC voltage potentials for output via the second power connections, said functional module being designed to operate without using the first control signals and/or the second control signals.

2. The converter unit of claim 1, further comprising a control unit arranged on the main printed circuit board and designed to generate the first and second control signals for the functional module, said conductor paths extending from the control unit to the first and second control connections.

3. A combination, comprising:
   two converter units comprising identical main printed circuit boards, each of the main printed circuit boards including first and second control connections receiving first and second control signals via conductor paths of the main printed circuit board; and
   functional modules respectively arranged on the main printed circuit boards at mutually corresponding locations and at least mechanically connected to the main printed circuit boards at least in a region of the first and second control connections, each of the functional modules including first and second power connections which are similar in design and arranged at mutually corresponding locations of the functional module, with an AC voltage supplied to the functional module via the first power connections being convertible into two DC voltage potentials for output via the second power connections, said functional module being designed to operate without using the first control signals and/or the second control signals,
   wherein the functional module of one of the two converter units is designed to operate without using the first control signals and/or the second control signals, and
   wherein the functional module of the other one of the two converter units is designed to
   use at least one of the first and second control signals, when the functional module of the one of the two converter units uses neither of the first and second control signals,
   use at least the second control signals, when the functional module of the one of the two converter units uses the first control signals but not the second control signals, and
   use at least the first control signals, when the functional module of the one of the two converter units uses the second control signals but not the first control signals.

4. The combination of claim 3, further comprising control units respectively arranged on the main printed circuit boards, each of the control units designed to generate the first and second control signals for the respective one of the functional modules, said conductor paths of the respective one of the main printed circuit boards extending from the control unit to the first and second control connections.

* * * * *